(12) United States Patent
Yu et al.

(10) Patent No.: US 9,170,486 B2
(45) Date of Patent: Oct. 27, 2015

(54) METHOD OF MANUFACTURING BLACK COLUMN SPACER, BLACK COLUMN SPACER, AND COLOR FILTER

(71) Applicant: Cheil Industries Inc., Gumi-si (KR)

(72) Inventors: Arum Yu, Uiwang-si (KR); Ji-Hye Kim, Uiwang-si (KR); Kyung-Won Ahn, Uiwang-si (KR); Jun-Ho Lee, Uiwang-si (KR); Seung-Jib Choi, Uiwang-si (KR); Hyun-Moo Choi, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/305,235

(22) Filed: Jun. 16, 2014

(65) Prior Publication Data

US 2015/0277224 A1    Oct. 1, 2015

(30) Foreign Application Priority Data

Mar. 27, 2014  (KR) .................. 10-2014-0036221
May 2, 2014    (KR) .................. 10-2014-0053553

(51) Int. Cl.
G03F 7/20    (2006.01)
G03F 7/00    (2006.01)
G02B 5/20    (2006.01)

(52) U.S. Cl.
CPC .............. *G03F 7/0007* (2013.01); *G02B 5/20* (2013.01)

(58) Field of Classification Search
CPC ............... G02F 1/136209; G02F 1/133512; G02F 1/13394; G02F 1/133516; G03F 7/0007; G02B 5/20
USPC ............................... 430/7; 349/106, 110, 156
See application file for complete search history.

(56) References Cited

U.S. PATENT DOCUMENTS

| | | | |
|---|---|---|---|
| 7,710,530 B2 | 5/2010 | Tsubata | |
| 7,746,443 B2 | 6/2010 | Lan et al. | |
| 2003/0123018 A1* | 7/2003 | Kim et al. | 349/155 |
| 2003/0162107 A1* | 8/2003 | Sato | 430/7 |
| 2005/0112485 A1 | 5/2005 | Lee et al. | |
| 2007/0229734 A1* | 10/2007 | Ho | 349/106 |
| 2010/0163811 A1 | 7/2010 | Oh et al. | |
| 2013/0077031 A1 | 3/2013 | Kim et al. | |
| 2013/0100386 A1 | 4/2013 | Kim et al. | |

FOREIGN PATENT DOCUMENTS

| | | |
|---|---|---|
| CN | 102866532 A | 1/2013 |
| JP | 2004-053706 A | 2/2004 |
| JP | 2004-334009 A | 11/2004 |
| JP | 4235576 B2 | 3/2009 |
| JP | 5195092 B2 | 5/2013 |
| KR | 10-2005-0049985 A | 5/2005 |
| KR | 10-2007-0069829 A | 7/2007 |
| KR | 10-2010-0066197 A | 6/2010 |
| KR | 10-2010-0125574 A | 12/2010 |
| KR | 10-2012-0083188 A | 7/2012 |
| KR | 10-2012-0105573 A | 9/2012 |
| KR | 10-2013-0032065 A | 4/2013 |
| KR | 10-2013-0036142 A | 4/2013 |
| KR | 10-2013-0044710 A | 5/2013 |
| KR | 10-2013-0053908 A | 5/2013 |
| KR | 10-2013-0062123 A | 6/2013 |
| KR | 10-2013-0079165 A | 7/2013 |
| KR | 10-2013-0113998 A | 10/2013 |
| TW | 201024921 A1 | 7/2010 |

* cited by examiner

*Primary Examiner* — John A McPherson
(74) *Attorney, Agent, or Firm* — Additon, Higgins & Pendleton, P.A.

(57) ABSTRACT

Disclosed are a method of manufacturing a black column spacer that includes preparing a substrate; forming a first organic layer on the substrate; forming a second organic layer on the first organic layer; performing exposure on the substrate on which the first organic layer and the second organic layer are formed using a half-tone mask; and developing the substrate and curing the resultant product, a black column spacer manufactured using the manufacturing method, and a color filter including the black column spacer.

20 Claims, 5 Drawing Sheets

METHOD OF MANUFACTURING BLACK COLUMN SPACER, BLACK COLUMN SPACER, AND COLOR FILTER

CROSS-REFERENCE TO RELATED APPLICATION

This application claims priority to and the benefit of Korean Patent Application No. 10-2014-0036221 filed in the Korean Intellectual Property Office on Mar. 27, 2014, and Korean Patent Application No. 10-2014-0053553 filed in the Korean Intellectual Property Office on May 2, 2014, the entire disclosure of each of which is incorporated herein by reference.

FIELD OF THE INVENTION

This disclosure relates to a method of manufacturing a black column spacer, a black column spacer manufactured by the method, and a color filter including the black column spacer.

BACKGROUND

A photosensitive resin composition is used in the manufacture of display devices such as a color filter, a liquid crystal display material, an organic light emitting diode, a display panel material, and the like. A color filter such as a color liquid crystal display and the like should include a black matrix on the border between colored layers such as red, green, blue, and the like to enhance display contrast or chromophore effects. This black matrix may be formed of a photosensitive resin composition.

There have been recent attempts to use the black matrix material as a column spacer supporting two TFT's and a C/F substrate having a liquid crystal layer therebetween. This column spacer is referred to as a black column spacer.

The black column spacer may properly function when a pattern step difference is accomplished by adjusting an exposure dose with a mask as well as basic characteristics such as compression displacement, an elasticity recovery rate, breaking strength, and the like are fulfilled. In addition, since the black column spacer exists upmost and may generate liquid crystal contamination, there is also a need to provide a black column spacer with reliability and solvent resistance (chemical resistance for a solvent).

SUMMARY

One embodiment provides a method of manufacturing a black column spacer that can have an improved development margin and solvent resistance.

Another embodiment provides a black column spacer manufactured by the method.

Yet another embodiment provides a color filter including the black column spacer.

One embodiment provides a method of manufacturing a black column spacer that includes preparing a substrate; forming a first organic layer on the substrate; forming a second organic layer on the first organic layer; performing exposure on the substrate on which the first organic layer and the second organic layer are formed using a half-tone mask; and developing the substrate and curing the resultant product.

In the manufacturing method, the first organic layer obtained after the developing and curing may have a higher optical depth than the second organic layer by greater than or equal to about 1.0.

The exposure may be performed by using a single half-tone mask, and the single half-tone mask may include a region transmitting about 100% of light and another region transmitting less than about 100% of light.

The first organic layer may be formed on the substrate by coating and drying a first composition including a binder resin, a reactive unsaturated compound, a photopolymerization initiator, a pigment, and a solvent.

The second organic layer may be formed on the substrate by coating and drying a second composition including a binder resin, a reactive unsaturated compound, a photopolymerization initiator and a solvent. The second composition may further include a pigment.

The pigment may include a black pigment, and the black pigment may be an organic black pigment and/or an inorganic black pigment. The black pigment may be lactam-based black, aniline black, perylene black, titanium black, cyanine black, lignin black, lactam-based organic black, RGB black, carbon black, or a combination thereof.

The binder resin may be a cardo-based binder resin, an acrylic-based binder resin, or a combination thereof.

The first composition and the second composition may independently include about 1 wt % to about 30 wt % of a binder resin; about 1 wt % to about 20 wt % of a reactive unsaturated compound; about 0.05 wt % to about 5 wt % of a photopolymerization initiator; about 1 wt % to about 30 wt % of a pigment; and a balance amount of a solvent. The first composition and the second composition may include independently different components from each other and/or have different amounts from each other.

The second composition may include about 3 wt % to about 70 wt % of a binder resin; about 2 wt % to about 40 wt % of a reactive unsaturated compound; about 0.1 wt % to about 5 wt % of a photopolymerization initiator; and a balance amount of a solvent.

The first composition and the second composition may independently further include an additive of malonic acid; 3-amino-1,2-propanediol; a silane-based coupling agent; a leveling agent; a fluorine-based surfactant; a radical polymerization initiator; or a combination thereof.

The first and second organic layers may be respectively formed by drying the first composition and the second composition at a temperature in a range of about 70° C. to about 110° C.

The first and second organic layers may be respectively formed by drying the first composition and the second composition for about one minute to about 10 minutes.

The curing may be performed at a temperature of about 150° C. to about 250° C. for about 10 minutes to about 60 minutes during developing and curing after the exposure.

Another embodiment provides a black column spacer manufactured by the manufacturing method.

Yet another embodiment provides a color filter including the manufactured black column spacer.

Other embodiments of the present invention are included in the following detailed description.

Accordingly, the method may provide a black column spacer having excellent development margin and solvent resistance. The method may also simplify the manufacturing process and decrease costs.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C20 alkyl, the term "alkenyl" refers to C2 to C20 alkenyl, the term "cycloalkenyl" refers to C3 to C20 cycloalkenyl, the term "heterocycloalkenyl" refers to C3 to C20 heterocycloalkenyl, the term "aryl" refers to C6 to C20 aryl, the term "arylalkyl" refers to C6 to C20 arylalkyl, the term "alkylene" refers to C1 to C20 alkylene, the term "arylene" refers to C6 to C20 arylene, the term "alkylarylene" refers to C6 to C20 alkylarylene, the term "heteroarylene" refers to C3 to C20 heteroarylene, and the term "alkoxylene" refers to C1 to C20 alkoxylene.

As used herein, when a specific definition is not otherwise provided, the term "substituted" refers to one substituted with at least one substituent including halogen (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, C1 to C20 alkyl, C2 to C20 alkenyl, C2 to C20 alkynyl, C6 to C20 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C20 heteroaryl, or a combination thereof, instead of at least one hydrogen.

As used herein, when a specific definition is not otherwise provided, the term "hetero" refers to one including at least one heteroatom including N, O, S and/or P in a chemical formula.

As used herein, when a specific definition is not otherwise provided, "(meth)acrylate" refers to both "acrylate" and "methacrylate," and "(meth)acrylic acid" refers to both "acrylic acid" and "methacrylic acid."

As used herein, when a specific definition is not otherwise provided, the term "combination" refers to mixing or copolymerization.

As used herein, when a specific definition is not otherwise provided, an unsaturated bond refers to a bond including another atom such as a carbonyl bond, an azo bond, and the like, as well as a multiple bond between carbon-carbon atoms.

As used herein, a cardo-based resin refers to a resin including at least one functional group selected from the following Chemical Formulae 1-1 to 1-11 in a backbone.

As used herein, when a specific definition is not otherwise provided, "*" indicates a point where the same or different atom or chemical formula is linked.

A method of manufacturing a black column spacer includes preparing a substrate; forming a first organic layer on the substrate; forming a second organic layer on the first organic layer; performing exposure on the front surface of the substrate on which the first organic layer and the second organic layer are formed using a half-tone mask; and developing the substrate and curing the resultant product.

Figure 1:
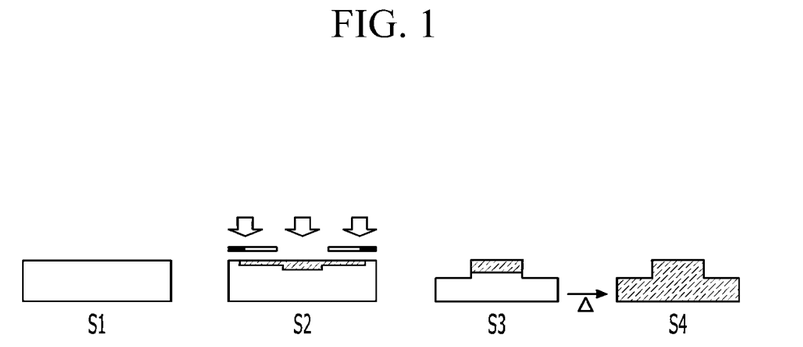
FIG. 1 is a schematic view showing a method of manufacturing a conventional black column spacer.
Figure 2:
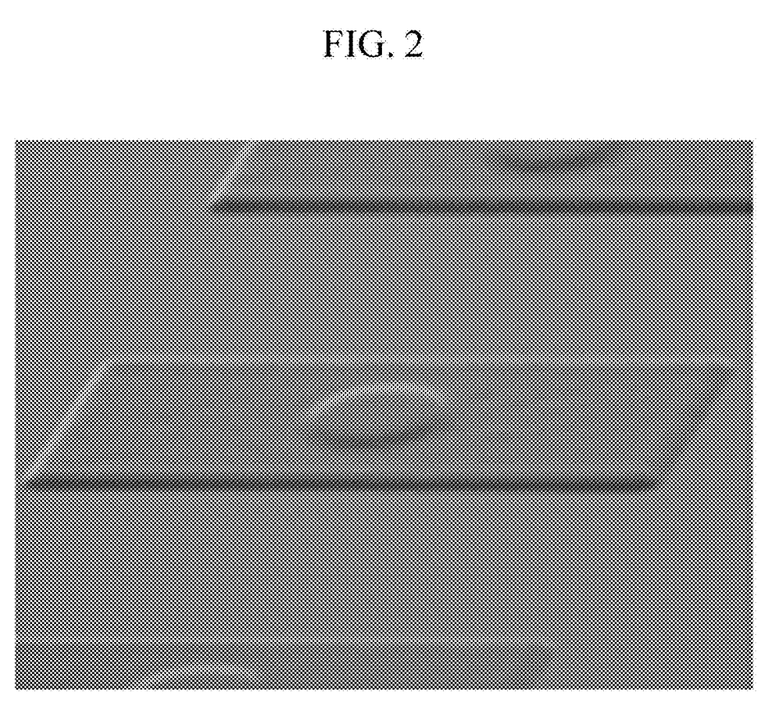
FIG. 2 is a scanning electron microscope (SEM) photograph showing a black column spacer according to Example 1.
Figure 3:
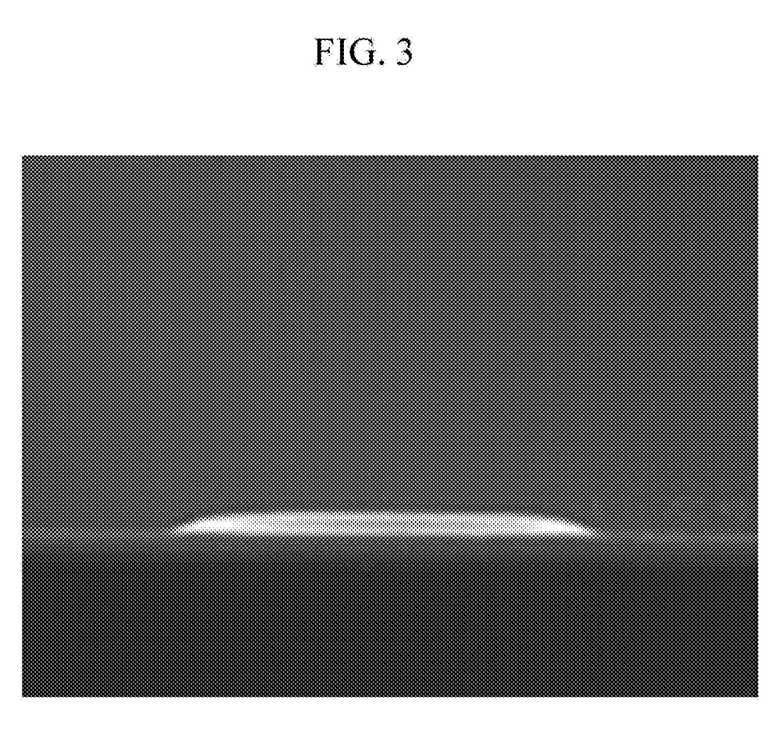
FIG. 3 is a scanning electron microscope (SEM) photograph showing a cross-section of the black column spacer according to Example 1.

A conventional method of manufacturing a black column spacer is shown in FIG. 1. Referring to FIG. 1, the method includes preparing a substrate (S1), coating a black column spacer composition on the substrate, exposing the black column spacer composition by using a half-tone mask (S2), developing it (S3), and thermally curing it with post-baking (S4).

In other words, the conventional method of manufacturing a black column spacer is performed by once coating a black column spacer composition on a substrate and then, exposing, developing and curing the coated black column spacer composition. The black column spacer composition has a high optical depth (OD) and thus, is not easily cured, since light does not penetrate or reach deeply into the black column spacer composition during the exposure (S2). Accordingly, a region where about a half of the black spacer is substantially cut off by half-tone light during the exposure is not cured at all but forms a step difference and then, is thermally cured during post-baking and forms a pattern. Herein, since a margin for forming the step difference of the black column spacer becomes very narrow, a process of maintaining a step difference having a uniform thickness on the entire surface of the substrate is difficult to realize.

In addition, after the patterning, the black column spacer requires transmittance of greater than or equal to about 20% at a Near-IR wavelength (about 800 nm to about 1000 nm) at which an align sensor is operated, so that an align key on a panel substrate may be recognized. An organic black pigment for forming the black column spacer may maintain, for example, greater than or equal to about 20% of transmittance at $\lambda$=about 950 nm. However, this organic black pigment has a problem of highly eluting a metal ion and a pigment in the spacer pattern by a solvent compared with carbon black, an inorganic black pigment. Accordingly, reliability of the black column spacer contacting a liquid crystal may be deteriorated. In addition, the lower layer of the black column spacer is not photo-cured at all but only thermally cured and thus, is not highly cured and does not secure necessary chemical resistance.

According to one embodiment, the method of manufacturing a black column spacer is performed by forming a first organic layer on a substrate to secure optical depth, additionally forming a second organic layer to realize a spacer and a step difference on the first organic layer, and then, conducting exposure, development and curing as one process to adjust sensitivity and developability of the first and second organic layers. Accordingly, since the surface of the first organic layer may not only be cured by light transmitted through the second organic layer capable of having remarkably lower optical depth (OD) than the first organic layer in the middle of realizing a step difference of the black spacer during the exposure but the development may also be stopped at a desired step difference during the development, the black column spacer may have very improved reliability and development margin.

Figure 4:
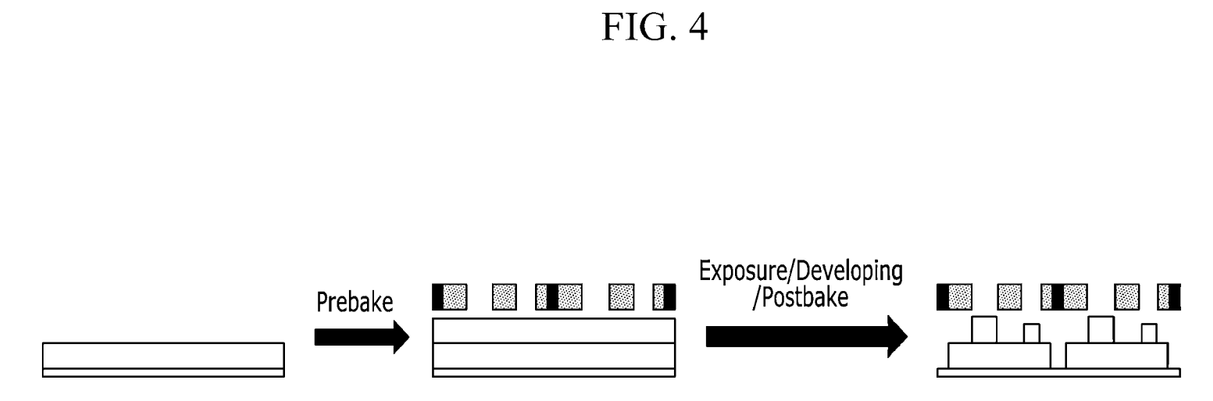
FIG. 4 is a view schematically showing a method of manufacturing a conventional black column spacer according to one embodiment.

Hereinafter, referring to FIG. 4, each step in the manufacturing method is illustrated in detail.

(A) Preparation of Substrate

A substrate for forming a black column spacer is prepared. The substrate may be an IZO substrate, a glass substrate, and the like but is not limited thereto and may include any material needing formation of a black column spacer and capable of forming the black column spacer.

(B) Formation of First Organic Layer

Formation of a first organic layer on the substrate may include coating a first composition for a first organic layer (also referred to herein as the first organic layer composition) on the substrate. The composition is coated to have a desired thickness, for example, a thickness of about 0.5 μm to about 25 μm, on a substrate, using a conventional method such as a spin or slit coating method, a roll coating method, a screen-printing method, an applicator method, and the like. The coated composition may be dried to form the first organic layer. The drying is a process of removing all or a part of a solvent in the first composition and may be performed by heat-treating the coated composition or putting it in a chamber including a vacuum pump. The heat treatment may be performed at a temperature of about 70° C. to about 110° C. for about 1 minute to about 10 minutes. In addition, the removal of the solvent by putting the coated composition in the chamber including a vacuum pump may be performed by putting the first composition in the chamber including a vacuum pump (about 0.1 torr to about 5 torr) and allowing it to stand for about 10 seconds to about 1 minute. Accordingly, all or a part of the solvent in the first composition may be removed to form the first organic layer.

The first composition may include a binder resin, a reactive unsaturated compound, a photopolymerization initiator, a pigment, and a solvent.

The first organic layer should have a high optical depth, and thus, the pigment may include a black pigment. The black pigment may include an inorganic black pigment, organic black pigment, or a combination thereof, for example, aniline black, perylene black, titanium black, cyanine black, lignin black, lactam-based organic black, RGB black, carbon black, or a combination thereof. In exemplary embodiments, the black pigment may include an inorganic black pigment and an organic black pigment, the inorganic black pigment may be carbon black, and the organic black pigment may be a lactam-based organic black represented by the following Chemical Formula A.

[Chemical Formula A]

The RGB black includes at least greater than or equal to about two kinds of color pigments selected from a red pigment, a green pigment, a blue pigment, a violet pigment, a yellow pigment, a magenta pigment and the like and expresses black.

When the black pigment includes carbon black, excellent light-blocking property, surface flatness, dispersion stability, compatibility with a binder resin, and the like may be obtained.

The black pigment may be used with a color calibrator. Examples of the color calibrator may include without limitation anthraquinone-based pigments, perylene-based pigments, phthalocyanine-based pigments, azo-based pigments, and the like, and combinations thereof.

In addition, a dispersing agent may be used therewith to disperse the pigment. The pigment may be pretreated with the dispersing agent on the surface or added therewith to prepare the first organic layer composition.

The dispersing agent may be a non-ionic dispersing agent, an anionic dispersing agent, a cationic dispersing agent, and the like. Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines, and the like, and these may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, and/or DISPERBYK-2001 made by BYK Co., Ltd.; EFKA-47, EFKA-47EA, EFKA-48, EFKA-49, EFKA-100, EFKA-400, and/or EFKA-450 made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; PB711, PB821, and the like made by Ajinomoto Inc.; and the like, and combinations thereof.

The dispersing agent may be included in an amount of about 0.1 wt % to about 15 wt % based on the total amount (total weight, 100 wt %) of the first organic layer composition. When the dispersing agent is included in an amount within this range, the first organic layer composition can have excellent stability, developability, and pattern-forming capability due to improved dispersion properties during manufacture of a black column spacer.

The pigment may be pre-treated using a water-soluble inorganic salt and a wetting agent. When the pigment is pre-treated, an average particle diameter of the pigment may become finer.

The pre-treatment may be performed by kneading the pigment with a water-soluble inorganic salt and a wetting agent and then, filtering and washing the kneaded pigment.

The kneading may be performed at a temperature of about 40° C. to about 100° C., and the filtering and washing may be performed by filtering the pigment after washing away an inorganic salt with water and the like.

Examples of the water-soluble inorganic salt may include without limitation sodium chloride, potassium chloride, and the like, and combinations thereof.

The wetting agent may allow the pigment to be uniformly mixed with the water-soluble inorganic salt and be pulverized. Examples of the wetting agent include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment may be included in an amount of about 1 wt % to about 30 wt %, for example about 2 wt % to about 20 wt %, based on the total amount (total weight, 100 wt %) of the first organic layer composition. When the pigment is included in an amount within the above range, resolution and pattern linearity can be improved.

The binder resin may include a cardo-based binder resin, an acrylic-based binder resin, or a combination thereof.

The binder resin may be a cardo-based binder resin. When the binder resin is a cardo-based binder resin, a first organic layer composition including the cardo-based binder resin can have excellent developability and sensitivity during photocuring and thus, fine pattern-forming capability. In particular, when the cardo-based binder resin is used, reliability of a black column spacer may be secured.

The cardo-based binder resin may include a repeating unit represented by the following Chemical Formula 1.

[Chemical Formula 1]

In the above Chemical Formula 1,

$R^1$ and $R^2$ are the same or different and are each independently hydrogen or a substituted or unsubstituted (meth)acryloyloxy alkyl group, $R^3$ and $R^4$ are the same or different and are each independently hydrogen, halogen or substituted or unsubstituted C1 to C20 alkyl, each $Z^1$ is the same or different and is each independently a single bond, O, CO, $SO_2$, $CR^7R^8$, $SiR^9R^{10}$ (wherein, $R^7$ to $R^{10}$ are the same or different and are each independently hydrogen or substituted or unsubstituted C1 to C20 alkyl), or a linking group represented by one of the following Chemical Formulae 1-1 to 1-11,

[Chemical Formula 1-1]

[Chemical Formula 1-2]

[Chemical Formula 1-3]

[Chemical Formula 1-4]

[Chemical Formula 1-5]

In the above Chemical Formulae 1-5, $R^a$ is hydrogen, ethyl, $C_2H_4Cl$, $C_2H_4OH$, $CH_2CH\!=\!CH_2$, or phenyl.

[Chemical Formula 1-6]

[Chemical Formula 1-7]

[Chemical Formula 1-8]

[Chemical Formula 1-9]

[Chemical Formula 1-10]

[Chemical Formula 1-11]

each $Z^2$ is the same or different and is each independently an acid dianhydride residual group, m1 and m2 are the same or different and are each independently an integer ranging from 0 to 4.

The cardo-based binder resin may include a functional group represented by the following Chemical Formula 2 at least one terminal end.

[Chemical Formula 2]

In the above Chemical Formula 2, $Z^3$ is represented by the following Chemical Formulae 2-1 to 2-7.

[Chemical Formula 2-1]

In the above Chemical Formula 2-1, $R^b$ and $R^c$ are the same or different and are each independently, hydrogen, substituted or unsubstituted C1 to C20 alkyl, an ester group, or an ether group.

[Chemical Formula 2-2]

[Chemical Formula 2-3]

[Chemical Formula 2-4]

[Chemical Formula 2-5]

In the above Chemical Formula 2-5, $R^d$ is O, S, NH, substituted or unsubstituted C1 to C20 alkylene, C1 to C20 alkylamine group, or C2 to C20 allylamine group.

[Chemical Formula 2-6]

[Chemical Formula 2-7]

The cardo-based resin may be prepared by mixing at least two of a fluorene-containing compound such as 9,9-bis(4-oxiranylmethoxyphenyl)fluorene, and the like; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthalic anhydride, and the like; a glycol compound such as ethylene glycol, propylene glycol, polyethylene glycol, and the like; an alcohol compound such as methanol, ethanol, propanol, n-butanol, cyclohexanol, benzylalcohol, and the like; a solvent-based compound such propylene glycol methylethylacetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyltriethylammonium chloride, and the like.

The cardo-based binder resin may have a weight average molecular weight of about 500 g/mol to about 50,000 g/mol, for example about 1,000 g/mol to about 30,000 g/mol. When the cardo-based binder resin a weight average molecular weight within the above range, a pattern may be well formed without a residue during manufacture of a black column spacer and without loss of a film thickness during development.

The acrylic-based binder resin is a copolymer of a first ethylenic unsaturated monomer and a second ethylenic unsaturated monomer that is copolymerizable therewith, and is a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like, and combinations thereof.

The first ethylenic unsaturated monomer may be included in an amount of about 5 to about 50 wt %, for example about 10 to about 40 wt %, based on the total amount (total weight, 100 wt %) of the acrylic-based resin.

Examples of the second ethylenic unsaturated monomer may include without limitation aromatic vinyl compounds such as styrene, α-methylstyrene, vinyl toluene, vinylbenzylmethylether and the like; unsaturated carboxylate ester compounds such as methyl(meth)acrylate, ethyl(meth)acrylate, butyl(meth)acrylate, 2-hydroxyethyl(meth)acrylate, 2-hydroxybutyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate, and the like; vinyl cyanide compounds such as (meth)acrylonitrile and the like; unsaturated amide compounds such as (meth)acrylamide, and the like; and the like. These may be used singularly or as a mixture of two or more.

Examples of the acrylic-based resin may include without limitation a methacrylic acid/benzylmethacrylate copolymer, a methacrylic acid/benzyl methacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. These may be used singularly or as a mixture of two or more.

The acrylic-based resin may have a weight average molecular weight of about 3,000 g/mol to about 150,000 g/mol, for example about 5,000 g/mol to about 50,000 g/mol or about 7,000 g/mol to about 30,000 g/mol. When the acrylic-based resin has a weight average molecular weight within the above range, the first organic layer composition may have excellent physical and chemical properties and an appropriate viscosity, and may have excellent close-contacting (adhesive) properties to a substrate during manufacture of a black column spacer.

The acrylic-based resin may have an acid value of about 15 mgKOH/g to about 150 mgKOH/g, for example about 80 mgKOH/g to about 130 mgKOH/g. When the acrylic-based resin has an acid value within the above range, a pixel pattern may have excellent resolution.

When the cardo-based binder resin is mixed with the acrylic-based binder resin, a (weight) ratio the cardo-based binder resin and the acrylic-based binder resin in the first composition may be about 99:1 to about 50:50.

When the acrylic-based binder resin is included in an amount of more than the amount of the cardo-based binder resin, chemical resistance and reliability may be deteriorated.

The first composition may include the binder resin in an amount of about 1 wt % to about 30 wt %, for example about 2 wt % to about 20 wt %, based on the total amount (total weight, 100 wt %) of the first composition. In some embodiments, the first composition may include the binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

For example, the cardo-based binder resin may be included in an amount of about 1 wt % to about 20 wt % based on the total amount of the first composition, and the acrylic-based binder resin may be included in an amount of about 1 wt % to about 20 wt % based on the total amount of the first composition.

When the binder resin is included in an amount within the above range, excellent sensitivity, developability, resolution, and pattern linearity may be realized.

The reactive unsaturated compound may be a monomer and/or oligomer and may include a mono-functional and/or multi-functional ester of (meth)acrylic acid including at least one ethylenic unsaturated double bond.

The reactive unsaturated compound has the ethylenic unsaturated double bond and thus, may cause sufficient polymerization during exposure in a pattern-forming process and form a pattern having excellent heat resistance, light resistance, and chemical resistance.

Examples of the reactive unsaturated compound may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like, and combinations thereof.

Commercially available examples of the reactive unsaturated compound include the following. The mono-functional (meth)acrylic acid ester may include without limitation Aronix M-101®, M-111®, and/or M-114® (Toagosei Chemistry Industry Co., Ltd.); KAYARAD TC-110S® and/or TC-120S® (Nippon Kayaku Co., Ltd.); V-158® and/or V-2311® (Osaka Organic Chemical Ind., Ltd.), and the like. Examples of a difunctional (meth)acrylic acid ester may include without limitation Aronix M-210® and/or M-240®, M-6200® (Toagosei Chemistry Industry Co., Ltd.), KAYARAD HDDA®, HX-220®, and/or R-604® (Nippon Kayaku Co., Ltd.), V-260®, V-312®, and/or V-335 HP® (Osaka Organic Chemical Ind., Ltd.), and the like. Examples of a tri-functional (meth)acrylic acid ester may include without limitation Aronix M-309®, M-400®, M-405®, M-450®, M-7100®, M-8030®, and/or M-8060® (Toagosei Chemistry Industry Co., Ltd.), KAYARAD TMPTA®, DPCA-20®, DPCA-30®, DPCA-60®, and/or DPCA-120® (Nippon Kayaku Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The reactive unsaturated compound may be treated with acid anhydride to improve developability.

The first composition may include the reactive unsaturated compound in an amount of about 1 wt % to about 20 wt %, for example about 1 wt % to about 10 wt %, based on the total amount (total weight, 100 wt %) of the first composition. In some embodiments, the first composition may include the reactive unsaturated compound in an amount of about 1, 2, 3, 4, 5, 6, 7, 8, 9, 10, 11, 12, 13, 14, 15, 16, 17, 18, 19, or 20 wt %. Further, according to some embodiments of the present invention, the amount of the reactive unsaturated compound can be in a range from about any of the foregoing amounts to about any other of the foregoing amounts.

When the reactive unsaturated compound is included in an amount within the above range, the reactive unsaturated compound can be sufficiently cured during exposure in a pattern-forming process and can have excellent reliability and thus, may form a pattern having excellent heat resistance, light resistance, and chemical resistance and also, excellent resolution and close-contacting properties.

The photopolymerization initiator may be a generally-used photopolymerization initiator in a photosensitive resin composition. Examples of the photopolymerization initiator may include without limitation acetophenone-based compounds, benzophenone-based compounds, thioxanthone-based compounds, benzoin-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, methyl benzoyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(tri chloromethyl)-6-piperonyl-s-triazine, 2-4-bis(trichloromethyl)-6-(4-methoxystyryl)-s-triazine, and the like, and combinations thereof.

Examples of the oxime-based compound may include without limitation O-acyloxime-based compounds, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like, and combinations thereof. Examples of the O-acyloxime-based compound may include without limitation 1,2-octandione, 2-dimethylamino-2-(4-methylbenzyl)-1-(4-morpholin-4-yl-phenyl)butan-1-one, 1-(4-phenylsulfanyl phenyl)butane-1,2-dione 2-oxime-O-benzoate, 1-(4-phenylsulfanyl phenyl)-octane-1,2-dione 2-oxime-O-benzoate, 1-(4-phenylsulfanyl phenyl)-octan-1-one oxime-O-acetate, 1-(4-phenylsulfanyl phenyl)butan-1-one oxime-O-acetate, and the like, and combinations thereof.

The photopolymerization initiator may further include one or more of a carbazole-based compound, a diketone-based compound, a sulfonium borate-based compound, a diazo-based compound, an imidazole-based compound, a biimidazole-based compound, and the like instead of the foregoing compounds.

The photopolymerization initiator may be used with a photosensitizer capable of causing a chemical reaction by absorbing light and becoming excited and then, transferring its energy.

Examples of the photosensitizer may include without limitation tetraethylene glycol bis-3-mercapto propionate, pentaerythritol tetrakis-3-mercapto propionate, dipentaerythritol tetrakis-3-mercapto propionate, and the like, and combinations thereof.

The first composition may include the photopolymerization initiator in an amount of about 0.05 to about 5 wt %, for example about 0.1 to about 5 wt %, based on the total amount (total weight, 100 wt %) of the first composition. In some embodiments, the first composition may include the photopolymerization initiator in an amount of about 0.05, 0.06, 0.07, 0.08, 0.09, 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

When the photopolymerization initiator is included in an amount within the above range, excellent reliability may be secured due to sufficiently curing during exposure in a pattern-forming process, a pattern may have excellent resolution and close-contacting properties as well as excellent heat resistance, light resistance, and chemical resistance, and transmittance may be prevented from deterioration due to a non-reaction initiator.

The solvent is a material having compatibility with the pigment, the binder resin, the reactive unsaturated compound, and the photopolymerization initiator but not reacting therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like, and combinations thereof. Additionally, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and combinations thereof may be also used.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate and the like, and combinations thereof may be used.

The first composition may include the solvent in a balance amount, for example about 40 wt % to about 90 wt %, based on the total amount (total weight, 100 wt %) of the first composition. In some embodiments, the first composition may include the solvent in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the first composition may have an appropriate viscosity resulting in improvement of coating characteristics of a black column spacer.

The first composition may further include one or more additives. Examples of the additives include without limitation malonic acid; 3-amino-1,2-propanediol; silane-based coupling agents; leveling agents; fluorine-based surfactants; radical polymerization initiators; and the like, and combinations thereof.

The silane-based coupling agent may have a reactive substituent such as but not limited to a vinyl group, a carboxyl group, a methacryloxy group, an isocyanate group, an epoxy group, and the like, in order to improve close-contacting properties with a substrate.

Examples of the silane-based coupling agent may include without limitation trimethoxysilyl benzoic acid, γ-methacryloxypropyl trimethoxysilane, vinyl triacetoxysilane, vinyl trimethoxysilane, γ-iso cyanate propyl triethoxysilane, γ-glycidoxypropyltrimethoxysilane, β-(3,4-epoxycyclohexyl) ethyltrimethoxysilane, and the like. These may be used singularly or in a mixture of two or more.

The silane-based coupling agent may be included in an amount of about 0.01 parts by weight to about 10 parts by weight based on about 100 parts by weight of the first composition. When the silane-based coupling agent is included in an amount within the above range, close-contacting properties, storage properties, and the like may be improved.

In addition, the first composition may further include a surfactant, for example a fluorine-based surfactant, in order to improve coating properties and prevent a defect if necessary.

Examples of the fluorine-based surfactant may include without limitation commercial fluorine-based surfactants such as BM1000® and/or BM1100® (BM Chemie Inc.); MEGAFACE F 142D®, F 172®, F 173®, and/or F 183® Dainippon Ink Kagaku Kogyo Co., Ltd.); FULORAD FC-135®, FULORAD FC-170C®, FULORAD FC-430®, and/or FULORAD FC-431® (Sumitomo 3M Co., Ltd.); SURFLON S-112®, SURFLON S-113®, SURFLON S-131®, SURFLON 5-141®, and/or SURFLON S-145® (Asahi Glass Co., Ltd.); SH-28PA®, SH-190®, SH-193®, SZ-6032®, and/or SF-8428® (Toray Silicone Co., Ltd.), and the like, and combinations thereof.

The surfactant may be used in an amount of about 0.001 to about 5 parts by weight based on about 100 parts by weight of the first composition. When the surfactant is included in an amount within the above range, excellent wetting on an IZO substrate or a glass substrate as well as coating uniformity may be secured, and a stain may not be produced.

Furthermore, the first composition may include one or more other additives such as but not limited to an antioxidant, a stabilizer, and the like in a predetermined amount unless they deteriorate properties of the first composition.

(C) Formation of Second Organic Layer

A second organic layer may be formed by coating a second composition (also referred to herein as the second organic layer composition and/or the second organic composition) on the first organic layer formed on the substrate. The coating of the second composition may be the same as that of the first composition. That is to say, the second composition is coated to have a desired thickness, for example, a thickness of about 2 μm to about 25 μm, on the first organic layer, using a spin or slit coating method, a roll coating method, a screen-printing method, an applicator method, and the like. Subsequently, the coated second composition may be dried to form the second organic layer.

The drying process may be the same as the above drying process of the first composition. In other words, the drying may be performed by heat-treating the second composition at a temperature of about 70° C. to about 110° C. for about 1 minute to about 10 minutes or allowing it to stand in a chamber including a vacuum pump (about 0.1 torr to about 5 torr) for about 10 seconds to about 1 minute. Accordingly, a part or all of the solvent in the second composition may be removed to form the second organic layer.

Since the second composition is used to form a step difference and thus does not necessarily require a high optical depth (OD), a pigment such as those described above with reference to the first composition may be not necessarily included in the second composition. In other words, the second composition may include a binder resin, a reactive unsaturated compound, a photopolymerization initiator, and a solvent, and optionally may further include a pigment if necessary. In addition, the second composition may further include one or more other additives also as described above for the first composition.

The second composition may include the same components as those described above included in the first composition. However, each component of the first and second compositions may be respectively included in a different amount, and thus, the first and second compositions may have a different optical depth (OD) after curing.

Accordingly, each component of the second composition for forming the second organic layer, namely, the binder resin, the reactive unsaturated compound, the photopolymerization initiator, the pigment and the solvent is the same as described above for the first composition for forming the first organic layer.

The second organic layer may have a lower optical depth (OD) than that of the first organic layer. Herein, since reliability of a black column spacer is secured, the second composition for forming a second organic layer may include less of a cardo-based binder resin as the binder resin but may further include other binder resins, for example, an acrylic-based binder resin and the like. When the second composition includes an acrylic-based binder resin in an amount greater than (more than) the cardo-based resin as the binder resin, properties of the black column spacer, for example, solvent resistance, a development margin, and the like may be further optimized.

The second composition may include the binder resin in an amount of about 3 wt % to about 70 wt %, for example, about 3 wt % to about 60 wt %, based on total amount (total weight, 100 wt %) of the second composition. In some embodiments, the second composition may include the binder resin in an amount of about 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the binder resin can be in a range from about any of the foregoing amounts to about any other of the foregoing amounts.

When the binder resin is included in an amount within the above range, excellent sensitivity, developability, resolution and linearity of a pattern may be obtained.

The second composition may include the reactive unsaturated compound in an amount of about 2 wt % to about 40 wt %, for example, about 3 to about 30 wt %, based on the total amount (total weight, 100 wt %) of the second composition. In some embodiments, the second composition may include the reactive unsaturated compound in an amount of about 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the reactive unsaturated compound can be in a range from about any of the foregoing amounts to about any other of the foregoing amounts.

When the reactive unsaturated compound is included in an amount within the above range, the second composition may be sufficiently cured during exposure in a pattern-forming process and may also realize excellent reliability, excellent heat, light and chemical resistances of a pattern, excellent resolution and close-contacting properties.

The second composition may include the photopolymerization initiator in an amount of about 0.1 wt % to about 5 wt %, for example, about 0.2 wt % to about 5 wt %, based on the total amount (total weight, 100 wt %) of the second composition. In some embodiments, the second composition may include the photopolymerization initiator in an amount of about 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

When the photopolymerization initiator is included in an amount within the above range, the second composition may be sufficiently cured during the exposure in the pattern-forming process and may also realize excellent reliability, excellent heat, light and chemical resistances of a pattern, and excellent resolution and close-contacting properties and also, may prevent transmittance deterioration due to a non-reaction initiator.

The second composition may include the solvent in a balance amount, for example about 40 wt % to about 90 wt %, based on the total amount (total weight, 100 wt %)_of the second composition. In some embodiments, the second composition may include the solvent in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the second composition may have appropriate viscosity and realize excellent processibility when a black column spacer is manufactured.

Since the second composition is coated after drying the first composition, the solvent in the second composition may have lower solubility than the solvent in the first composition. In exemplary embodiments, the solvent for the first composition may include without limitation PGMEA, PGME, EDM, 3-MBA, EEP, and the like, and combinations thereof, and the solvent for the second composition may include without limitation PGMEA, 3-MBA, n-butyl acetate, n-pentyl acetate, n-hexyl acetate, and the like, and combinations thereof.

(D) Exposure

After forming the first and second organic layers on the substrate, the front surface of the substrate having the first and second organic layers applied thereof is exposed. Reference is made herein to a front exposure, which indicates exposure of the front surface of the substrate including the first and second organic layers thereon that is opposite to the rear surface, and thus rear exposure, of the substrate and thus indicates exposure of the front surface of the substrate on which the first and second organic layers are formed. In other words, the exposure may indicate only exposure of the front surface of the substrate.

The front exposure may pattern a black matrix and a column spacer as one process by using a single half-tone mask. The half-tone mask may include a region completely transmitting light and another region partially transmitting light. The single half-tone mask may include a region transmitting about 100% of light and another region less than or equal to about 100% of light during the exposure. The region transmitting less than about 100% of light during the exposure, for example, may transmit about 20% to about 70%, that is, about 21% to about 70%, about 22% to about 70%, about 23% to about 70%, about 24% to about 70%, about 25% to about 70%, about 26% to about 70%, about 27% to about 70%, about 28% to about 70%, about 29% to about 70%, about 30% to about 70%, about 31% to about 70%, about 32% to about 70%, about 33% to about 70%, about 34% to about 70%, about 35% to about 70%, about 36% to about 70%, about 37% to about 70%, about 38% to about 70%, about 39% to about 70%, about 40% to about 70%, about 41% to about 70%, 42% to about 70%, about 43% to about 70%, about 44% to about 70%, about 45% to about 70%, about 46% to about 70%, about 47% to about 70%, about 48% to about 70%, about 49% to about 70%, about 50% to about 70%, about 51% to about 70%, about 52% to about 70%, about 53% to about 70%, about 54% to about 70%, about 55% to about 70%, about 56% to about 70%, about 57% to about 70%, about 58% to about 70%, about 59% to about 70%, about 60% to about 70%, about 61% to about 70%, about 62% to about 70%, about 63% to about 70%, about 64% to about 70%, about 65% to about 70%, about 66% to about 70%, about 67% to about 70%, about 68% to about 70%, or about 69% to about 70%.

(E) Developing and Curing

After the exposure, the first and second organic layers may have an optical depth difference of greater than or equal to about 1.0 by development and curing. For example, the first organic layer may have an optical depth of about 1.0 to about 5.0.

The curing may be performed at a temperature of about 150° C. to about 250° C. for about 10 minutes to about 60 minutes. In this way, the heat treatment fully cures a non-photocured region and has an effect of increasing reliability and pattern stability.

Another embodiment provides a black column spacer manufactured using the method of manufacturing the above black column spacer.

Yet another embodiment provides a color filter including the black column spacer.

Hereinafter, the present invention is illustrated in more detail with reference to the following examples. These examples, however, are not in any sense to be interpreted as limiting the scope of the invention.

EXAMPLE

Preparation of First (Organic Layer) Composition and Second (Organic Layer) Composition Preparation Examples 1 to 3

Each organic layer composition according to Preparation Examples 1 to 3 is prepared by using the following components of the compositions provided in the following Tables 1 to 3.

Specifically, a photopolymerization initiator is dissolved in a solvent, the solution is sufficiently agitated at room temperature for greater than or equal to 30 minutes, a binder resin and a reactive unsaturated compound are sequentially added thereto, and the mixture is agitated at room temperature for about 1 hour. Subsequently, other additives are added to the agitated solution, the mixture is agitated for about 10 minutes, then, a pigment is added thereto, and the obtained mixture is agitated at room temperature for greater than or equal to 2 hours. Then, the product is three times filtered to remove impurities therein, obtaining an organic layer composition.

Preparation Example 1

Manufacture of First Organic Layer

TABLE 1

(unit: g)

| Components | | Amount |
|---|---|---|
| Binder resin | cardo-based binder resin (V259ME, Nippon Steel) | 9.64 |
| Reactive unsaturated compound | dipentaerythritolhexaacrylate (Nippon Shokubai) | 2.566 |
| Photopolymerization initiator | OXE01 (BASF) | 0.464 |
| Solvent | PGMEA | 63.211 |
| | EDM | 15.343 |

TABLE 1-continued (unit: g)

| Components | | Amount |
|---|---|---|
| Pigment | mill base (Mikuni, PWC 18%) including lactam-based organic black (BASF) | 6.397 |
| | mill base including carbon black (Tokushiki Co., Ltd., PWC 25%) | 1.438 |
| Additive | y-glycidoxy propyl trimethoxysilane (S-510, Chisso Corporation) | 0.941 |

In Table 1, the lactam-based organic black is represented by the following Chemical Formula A.

[Chemical Formula A]

Preparation Example 2

Manufacture of Second Organic Layer

TABLE 2

(unit: g)

| Components | | Amount |
|---|---|---|
| Binder resin | cardo-based binder resin (V259ME, Nippon Steel) | 4.718 |
| | acrylic-based binder resin (BX-04, Nippon Shokubai) | 19.456 |
| Reactive unsaturated compound | dipentaerythritolhexaacrylate (Nippon Shokubai) | 8.728 |
| Photopolymerization initiator | OXE01 (BASF) | 0.489 |
| Solvent | n-butyl acetate | 65.039 |
| Additive | y-glycidoxy propyl trimethoxysilane (S-510, Chisso Corporation) | 1.570 |

Preparation Example 3

Manufacture of Second Organic Layer

TABLE 3

(unit: g)

| Components | | Amount |
|---|---|---|
| Binder resin | cardo-based binder resin (V259ME, Nippon Steel) | 18.200 |

TABLE 3-continued (unit: g)

| | Components | Amount |
|---|---|---|
| Reactive unsaturated compound | dipentaerythritolhexaacrylate (Nippon Shokubai) | 4.368 |
| Photopolymerization initiator | OXE01 (BASF) | 1.303 |
| Solvent | n-butyl acetate | 75.504 |
| Pigment | mill base (Mikuni, PWC 18%) including lactam-based organic black (BASF) | 1.958 |
| | mill base including carbon black (Tokushiki Co., Ltd., PWC 25%) | 0.337 |
| Additive | y-glycidoxy propyl trimethoxysilane (S-510, Chisso Corporation) | 0.330 |

(In Table 3, the lactam-based organic black is represented by the following Chemical Formula A.

[Chemical Formula A]

)

Manufacture of Black Column Spacer

Example 1

(1) Coating of First (Organic Layer) Composition and Formation of First Organic Layer The first (organic layer) composition according to Preparation Example 1 is coated to be 1.5 µm thick on a predetermined pre-treated IZO substrate in a method of spin or slit coating, roll coating, screen printing, using an applicator, and the like, and dried by heating a hot-plate at 70° C. to 100° C. for 1 minute to 10 minutes to remove a solvent therein, forming a first organic layer.

(2) Coating of Second (Organic Layer) Composition and Formation of Second Organic Layer The second (organic layer) composition according to Preparation Example 2 is coated to be 1.5 µm thick on the first organic layer formed on the IZO substrate in a method of spin or slit coating, roll coating, screen printing, using an applicator, and the like and dried by heating a hot-plate at 70° C. to 100° C. for 1 minute to 10 minutes to remove a solvent therein, forming a second organic layer.

(3) Exposure

The front side of the second organic layer is exposed by putting a mask having a half-tone region for forming a black matrix pattern (transmit 20% to 70% of light) and a full tone region for forming a column spacer pattern (transmit 100% of light) and radiating an actinic ray of 200 nm to 500 nm with an exposer (Ushio Inc., HB-50110AA) to pattern the first and second organic layers. As for a light source in the radiation, a low pressure mercury lamp, a high pressure mercury lamp, an ultra high pressure mercury lamp, a metal halide lamp, an argon gas laser, and the like may be used, and X-ray, an electron beam, and the like may also be used if necessary. An exposure dose may vary depending on kind of components in the composition, mixing amount, and a film thickness during drying but may be less than or equal to 500 mJ/cm$^2$ when the high pressure mercury lamp is used (by using a 365 nm sensor).

(4) Developing

The exposed organic layer is developed with a 0.2 wt % potassium hydroxide (KOH) aqueous solution by using a developer (SVS Corp., SSP-200) to dissolve and remove an unnecessary region and leave the exposed region and thus, form a pattern.

(5) Curing

The image pattern obtained by the developing is post-heated to obtain an excellent pattern in terms of heat resistance, light resistance, close-contacting properties, crack resistance, chemical resistance, high strength, and storage stability, and the like. Specifically, the image pattern obtained by the developing is heated at 230° C. in an oven for 30 minutes, manufacturing a black column spacer specimen.

Example 2

A black column spacer is manufactured according to the same method as Example 1 except for using the second (organic layer) composition according to Preparation Example 3 instead of the second (organic layer) composition according to Preparation Example 2.

Comparative Example 1

A black column spacer is manufactured according to the same method as Example 1 except for coating the first (organic layer) composition according to Preparation Example 1 to be 3.0 µm thick instead of the second (organic layer) composition according to Preparation Example 2.

Evaluation 1: Optical Depth (OD)

The organic layer compositions according to Preparation Examples 1 to 3 are respectively coated to be 1.5 µm thick on a 10 cm*10 cm IZO substrate with a spin coater (Mikasa Co., Ltd., Opticoat MS-A150), soft-baked (or pre-baked) on a hot-plate at 80° C. for 150 seconds, and exposed with 50 mJ by using an exposer (Ushio Inc., HB-50110AA) and a photo mask. Subsequently, the obtained organic coating layers (SVS Corp., SSP-200) are respectively developed in a 0.2 wt % potassium hydroxide (KOH) aqueous solution for 150 seconds and hard-baked (or post-baked) in an oven at 230° C. for 30 minutes, obtaining each patterned specimen. Optical depths of the specimens are measured and provided in the following Table 4.

TABLE 4

|  | Preparation Example 1 | Preparation Example 2 | Preparation Example 3 |
|---|---|---|---|
| Optical depth (OD) | 2.2 | 0 | 0.3 |

Evaluation 2: Development Margin

Figure 5:
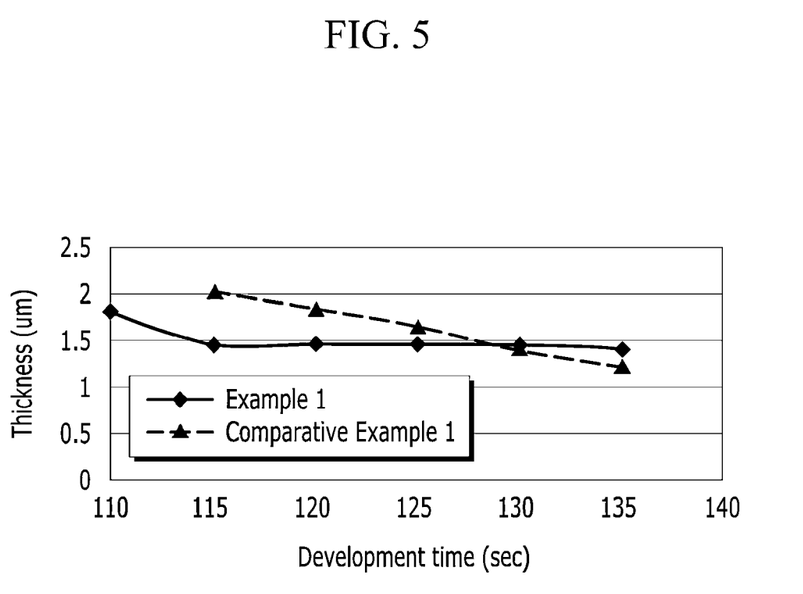
FIG. 5 is a graph showing development margins of black column spacers according to Example 1 and Comparative Example 1.

Thickness and step difference of the black column spacer specimens of Examples 1 and 2 and Comparative Example 1 are measured by using a contact type thickness meter (KLA-Tencor Corp., α-stepper) or a non-contact type thickness meter (3-D profiler) to evaluate development margin thereof, and the results are provided in FIG. 5.

Referring to FIG. 5, the black column spacer specimens of Examples 1 and 2 exhibit a small thickness decrease as development time passes and thus, an excellent development margin, while the black column spacer specimen of Comparative Example 1 exhibit a large thickness decrease (0.414 μm/10 sec) as development time passes and thus, exhibits an insufficient development margin.

Evaluation 3: Solvent Resistance

The black column spacer specimens of Examples 1 and 2 and Comparative Example 1 are cut into a size of 1 cm*1 cm, put in a glass bottle containing NMP of 5 mL, allowed to stand in a 100° C. oven for 15 minutes, and examined if their colors came out, and the results are provided in the following Table 5.

Decoloring Measurement Display Method
X: no decoloring when examined with the naked eye
○: high decoloring when examined with the naked eye

TABLE 5

|  | Example 1 | Example 2 | Comparative Example 1 |
|---|---|---|---|
| Decoloring | X | X | ○ |

Referring to Table 5, Examples 1 and 2 exhibit excellent solvent resistance without decoloring compared with Comparative Example 1.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A method of manufacturing a black column spacer, comprising:
preparing a substrate,
forming a first organic layer on the substrate,
forming a second organic layer on the first organic layer,
performing exposure on the substrate on which the first organic layer and the second organic layer are formed using a half-tone mask, and
developing the substrate and curing the resultant product.

2. The method of claim 1, wherein the first organic layer obtained after the developing and curing has a higher optical depth than the second organic layer by greater than or equal to about 1.0.

3. The method of claim 1, wherein the exposure is performed by using a single half-tone mask,
wherein the single half-tone mask has a region transmitting about 100% of light and another region transmitting less than about 100% of light during the exposure.

4. The method of claim 1, wherein the formation of the first organic layer comprises coating and drying a first composition comprising a binder resin, a reactive unsaturated compound, a photopolymerization initiator, a pigment and a solvent on the substrate.

5. The method of claim 4, wherein the pigment comprises a black pigment.

6. The method of claim 5, wherein the black pigment comprises aniline black, perylene black, titanium black, cyanine black, lignin black, lactam-based organic black, RGB black, carbon black, or a combination thereof.

7. The method of claim 4, wherein the binder resin comprises a cardo-based binder resin, an acrylic-based binder resin, or a combination thereof.

8. The method of claim 4, wherein the first composition comprises about 1 wt % to about 30 wt % of a binder resin; about 1 wt % to about 20 wt % of a reactive unsaturated compound; about 0.05 wt % to about 5 wt % of a photopolymerization initiator; about 1 wt % to about 30 wt % of a pigment; and a balance amount of a solvent.

9. The method of claim 4, wherein the first composition further comprises malonic acid; 3-amino-1,2-propanediol; a silane-based coupling agent; a leveling agent; a fluorine-based surfactant; a radical polymerization initiator; or a combination thereof.

10. The method of claim 1, wherein the formation of the second organic layer comprises coating and drying a second composition comprising a binder resin, a reactive unsaturated compound, a photopolymerization initiator and a solvent.

11. The method of claim 10, wherein the second composition further comprises a pigment.

12. The method of claim 11, wherein the pigment comprises a black pigment.

13. The method of claim 11, wherein the second composition further comprises malonic acid; 3-amino-1,2-propanediol; a silane-based coupling agent; a leveling agent; a fluorine-based surfactant; a radical polymerization initiator; or a combination thereof.

14. The method of claim 10, wherein the binder resin comprises a cardo-based binder resin, an acrylic-based binder resin, or a combination thereof.

15. The method of claim 10, wherein the second composition comprises about 3 wt % to about 70 wt % of a binder resin; about 2 wt % to about 40 wt % of a reactive unsaturated compound; about 0.1 wt % to about 5 wt % of a photopolymerization initiator; and a balance amount of a solvent.

16. The method of claim 10, wherein the second composition further comprises malonic acid; 3-amino-1,2-propanediol; a silane-based coupling agent; a leveling agent; a fluorine-based surfactant; a radical polymerization initiator; or a combination thereof.

17. The method of claim 1, wherein the first and second organic layers are respectively formed by drying the first composition and the second composition for about 1 minute to about 10 minutes.

18. The method of claim 1, wherein the curing is performed at a temperature of about 150° C. to about 250° C. for about 10 minutes to about 60 minutes during the developing and curing after the exposure.

19. A black column spacer manufactured by the manufacturing method of claim 1.

20. A color filter including the manufactured black column spacer of claim 19.

* * * * *